United States Patent
Morimoto et al.

(10) Patent No.: US 7,232,631 B2
(45) Date of Patent: Jun. 19, 2007

(54) MASK FOR CHARGED PARTICLE BEAM EXPOSURE, AND METHOD OF FORMING THE SAME

(75) Inventors: Kenichi Morimoto, Tokyo (JP); Yoshinori Kinase, Tokyo (JP); Yuki Aritsuka, Tokyo (JP)

(73) Assignee: Dai Nippon Prinitng Co., Ltd., Tokyo (JP)

( * ) Notice: Subject to any disclaimer, the term of this patent is extended or adjusted under 35 U.S.C. 154(b) by 427 days.

(21) Appl. No.: 10/839,772

(22) Filed: May 4, 2004

(65) Prior Publication Data

US 2005/0008946 A1    Jan. 13, 2005

(30) Foreign Application Priority Data

May 8, 2003  (JP)  ............................ 2003-130772

(51) Int. Cl.
*G03F 9/00*    (2006.01)
(52) U.S. Cl. ........................... 430/5; 430/296; 430/942
(58) Field of Classification Search .................... 430/5, 430/296, 942
See application file for complete search history.

(56) References Cited

U.S. PATENT DOCUMENTS 5,357,899 A * 10/1994 Bassous et al. ................ 117/4
5,466,904 A   11/1995 Pfeiffer et al. ......... 219/121.25

FOREIGN PATENT DOCUMENTS

JP    2725319    12/1997
JP    2829942    9/1998

OTHER PUBLICATIONS

Abstracts of The 46th International Conference on Electron, Ion and Photon Beam Technology and Nanofabrication,p. 401, 'Fabrication of complete 8" stencil mask for electron projection lithography', May 28-May 31, 2002.

* cited by examiner

Primary Examiner—Christopher G. Young
(74) Attorney, Agent, or Firm—James H. Walters

(57) ABSTRACT

The present invention relates to an SOI substrate as a mask substrate for the charged particle beam exposure of which a silicon oxidized film has a suitable thickness for the fabrication of a mask, a silicon membrane layer has a suitable thickness as a mask membrane and is a low stress membrane having no defects and excellent uniformity and relates to its forming method. The SOI substrate is an SOI wafer which is obtained by forming an oxidized film on a first silicon wafer, forming a separation layer by hydrogen ion implantation into the first silicon wafer via the oxidized film, bonding the first silicon wafer onto a second silicon wafer, and cleaving the first silicon wafer from the second silicon wafer at the separation layer so that a silicon membrane layer is formed on the second silicon layer via the oxidized film. The method of forming the SOI wafer is characterized by comprising a step of causing epitaxial growth of silicon to form a silicon membrane layer on said silicon membrane layer simultaneously with doping either or both of boron and phosphorus.

10 Claims, 7 Drawing Sheets

MASK FOR CHARGED PARTICLE BEAM EXPOSURE, AND METHOD OF FORMING THE SAME

BACKGROUND OF THE INVENTION

The present invention relates to a method of forming a mask for use in the lithography for manufacturing semiconductor devices and, more particularly, to a mask for the charged particle beam exposure which transcribes a mask pattern onto a wafer using charged particle beams such as electron beams and ion beams and to a method for forming the same.

With miniaturization and increase in integration of semiconductor elements in semiconductor integrated circuits, an electron-beam projection lithography for transcribing a predetermined configuration onto a wafer using charged particle beams, especially using electron beams, was developed instead of the conventional photolithography using light beam. Recently, the development of EPL (Electron-beam Projection Lithography) method achieving higher throughput has advanced. As an electron-beam projection lithography, there is a method in which a prescribed mask pattern is divided into a plurality of sections, stencil masks formed with opening patterns each having a predetermined size and a predetermined arrangement are prepared, and electron beams are incident on the sections so that electron beams thus formed by the opening patterns are transcribed onto a wafer as a subject substrate on some reduced scale. There has been developed a system for forming a device pattern by combining prescribed patterns separately formed on the mask onto the subject substrate (for example, see Patent Document 1).

An example of a mask used for the aforementioned electron-beam projection lithography is shown in FIGS. 8(a), 8(b). Shown in FIGS. 8(a), 8(b) is an example of a mask 70 used for the electron-beam exposure using a wafer substrate of 8 inches. FIG. 8(a) is an entire view of the mask having two pattern regions (132.57 mm×54.43 mm) 71. Each of the pattern regions 71 comprises a membrane mask pattern 72 and a strut 73 (0.17 mm in width).

The membrane mask pattern 72 is a pattern with through-holes for transmitting electron beams which are formed in a silicon membrane. Since the membrane mask pattern 72 is quite thin, a pattern region is divided and reinforced by a supporting grillage, referred to as "strut" 73 (0.17 mm in width), from the back so as to reinforce the membrane mask pattern 72, thereby reducing the distortion of the pattern region and improving the accuracy of position of the pattern region. FIG. 8(b) is a partial enlarged schematic view of FIG. 8(a). The membrane mask pattern 72 is formed in interstices of the strut 73.

Therefore, the quality and characteristics of the silicon membrane are important for the purpose of forming a mask for the charged particle beam exposure of high quality and high accuracy.

Since the silicon of the membrane side and the silicon of the strut side are subjected to etching in separate processes, an etching stop layer having a predetermined thickness is required between the silicon of the membrane side and the silicon of the strut side in the mask substrate during fabrication of the mask. Generally used as such etching stop layer is a silicon oxidized film.

As for the mask substrate for forming the aforementioned mask for the charged particle beam exposure, there is a method using an SOI (Silicon On Insulator) substrate in which a silicon membrane is formed via a silicon oxidized film on a silicon wafer and a method using a substrate on which a silicon membrane is formed by sputtering via a metallic layer on a silicon wafer.

SOI substrate is reliable because SOI substrates have been practically employed as semiconductor circuit substrates for LSI and a silicon membrane as an upper layer for fabrication of pattern possesses higher reliability in quality because the silicon membrane is single crystal and is formed with zero defects.

As the manufacturing method of SOI substrate, there are two practical methods such as a bonding method and an implanting method. There are some kinds of SOI substrates corresponding to these manufacturing methods. Some SOI substrates have been studied as mask substrates for forming masks used for the charged particle beam exposure.

As the bonding method, for example, a silicon substrate (referred to as "base wafer") as a support substrate is subjected to thermal oxidation, a different silicon substrate (referred to as "bond wafer") used for forming a silicon membrane layer is bonded to the base wafer, and the bond wafer is subjected to lapping and polishing whereby a significant amount of thickness is reduced, thereby forming a wafer substrate as the silicon membrane layer (for example, see Patent Document 1).

Examples of substrate according to another bonding method include a Smart Cut wafer substrate in which a thermal-oxidized wafer (bond wafer) subjected to hydrogen ion implantation is bonded to a base wafer, and an ELTRAN (Epitaxial Layer Transfer) wafer substrate in which a wafer (bond wafer) having an epitaxial layer formed thereon is bonded to a base wafer.

As an example of substrate according to the implanting method, there is an SIMOX (Separation by Implanted Oxygen) wafer substrate in which the wafer substrate is subjected to oxygen ion implantation so as to form an implanted silicon oxidized film.

However, in a mask for the charged particle beam exposure employing the SOI substrate according to the method described in Patent Document 2, the silicon membrane layer bonded on the wafer substrate is subjected to lapping and polishing so as to have a reduced thickness. Therefore, larger variation in thickness of substrate should be caused. While the desired thickness is on the order of 2 μm, there may be differences about ±0.5 μm. Accordingly, the SOI substrate has a problem that it is not suitable for practical use for masks of high accuracy. Though there is a method called PACE (Plasma Assisted Chemical Etching) as a lapping and polishing technology which can improve the distribution in thickness to ±0.1 μm, this method provide poor productivity. For example, in case of processing an SOI substrate of 200 mm in diameter to remove 3.8 μm with accuracy of ±0.1 μm, the PACE process should be conducted three times so that one hour or more is taken for one substrate.

On the other hand, as for the mask for the charged particle beam exposure employing the SOI substrate according to the other method, for example, in case of a SIMOX (Separation by Implanted Oxygen) wafer substrate in which the wafer substrate is subjected to oxygen ion implantation so as to form an implanted silicon oxidized film, the silicon oxidized film is very thin such as 0.14 μm or less. This is insufficient, as an etching stop layer during the fabrication of mask. Further, the silicon membrane layer to be a membrane is also thin such as 0.25 μm or less. A mask for the charged particle beam exposure formed using the SOI substrate has a problem that the strength of the membrane is insufficient as the mask pattern. As for the Smart Cut wafer substrate in which a thermal-oxidized wafer (bond wafer) subjected to hydrogen ion implantation is bonded to a base wafer, the silicon membrane layer to be a membrane is thin such as 0.4 µm or less. A mask for the charged particle beam exposure formed using the SOI substrate has a problem that the strength of the membrane is insufficient as the mask pattern. In the ELT-RAN (Epitaxial Layer Transfer) wafer substrate in which a wafer (bond wafer) having an epitaxial layer formed thereon is bonded to a base wafer, the silicon oxidized film and the silicon membrane layer can be formed to have desired thicknesses. However, the mask for the charged particle beam exposure formed by employing this substrate has a problem of large distortion of the mask pattern due to the compressive stress (300–400 MPa in case that the thickness of $SiO_2$ is 1 µm) of the silicon oxidized film. As one of improvement measures, there is a method of imparting tensile stress to the silicon membrane by doping impurity ion such as boron or phosphorus of which atom radius is smaller than that of silicon into the silicon membrane by ion implantation in order to reduce the stress during the formation of mask pattern. However, since the required amount to be doped is too much such as $1 \times 10^{18}$ atoms/cm$^3$, it takes too much time to obtain the desired doping amount by the ion implantation. This means there is a problem that it is difficult to commercially achieve practical use.

On the other hand, a method of forming a mask for the charged particle beam exposure in which a silicon membrane is formed by way of sputtering has an advantage that the etching selectivity is improved because metal can be used as an etching stop layer (for example, see non patent document 1).

However, the structure of the silicon membrane formed by way of sputtering is in amorphous state and the silicon membrane is therefore not dense. If abnormal particles of silicon are generated, defects are produced. Accordingly, it is difficult to form a silicon membrane layer without defects and having uniform thickness. Thus, there is a problem that it is hard to obtain a high quality mask using a mask blank prepared by this forming method. In addition, since electrons are scattered at boundaries crystal particles in amorphous silicon, heat may be stored in the obtained mask. Therefore, there is an essential problem that the heat deformation of the mask is inevitable during the electron-beam exposure projection.

[Patent Document 1]
Japanese Patent No. 2829942
[Patent Document 2]
Japanese Patent No. 2725319
[Non-patent Document 1]
Abstracts of The 46$^{th}$ International Conference on Electron, Ion and Photon Beam Technology and Nanofabrication, p401, "Fabrication of complete 8" stencil mask for electron projection lithography".

SUMMARY OF THE INVENTION

The present invention is made in order to solve the above described problems. It is an object of the present invention to provide a mask for the charged particle beam exposure, made by employing an SOI substrate as a mask substrate for the charged particle beam exposure, in which a silicon oxidized film has a thickness suitable for fabrication of the mask and a silicon membrane layer has a thickness suitable as a mask membrane and is a low stress and single crystal membrane without defects and having excellent uniformity, and to provide a method of forming such a mask.

In order to achieve the above described object, a mask for the charged particle beam exposure according to claim 1 of the present invention is a mask for the charged particle beam exposure which is made by employing an SOI substrate having a silicon layer on which a silicon oxidized film and a silicon membrane layer are formed, wherein said silicon membrane layer is significantly or entirely made of epitaxial grown silicon and said silicon membrane layer contains either or both of boron and phosphorus in a doping amount of $1 \times 10^{18}$ atoms/cm$^3$ or more. In the present invention, the doping amount is measured by SIMS (secondary ion mass spectrometry).

The thickness of the silicon oxidized film is in a range of from 0.1 µm to 1 µm. In a mask for the charged particle beam exposure, as a more preferable mode, according to claim 2 of the present invention, the thickness of said silicon oxidized film is in a range of from 0.2 µm to 1 µm and the thickness of said silicon membrane layer is in a range from 0.5 µm to 2 µm. When the silicon oxidized film has a thickness less than 0.2 µm, it must be difficult to make etching stop completely. On the other hand, when the silicon oxidized film has a thickness exceeding 1 µm, it must be difficult to control distortion of pattern due to the internal stress. Further, when the silicon membrane layer has a thickness less than 0.5 µm, the strength must be insufficient as a mask pattern in membrane. On the other hand, when the silicon membrane layer has a thickness exceeding 2 µm, it must be difficult to form a fine and high-precision pattern.

In a mask for the charged particle beam exposure, as a more preferable mode, according to claim 3 of the present invention, boron is contained in the silicon membrane layer in an average doping amount of from $6.7 \times 10^{18}$ to $1.3 \times 10^{20}$ atoms/cm$^3$.

In a mask for the charged particle beam exposure, as a more preferable mode, according to claim 4 of the present invention, phosphorus is contained in the silicon membrane layer in an average doping amount of from $2.0 \times 10^{19}$ to $4.3 \times 10^{20}$ atoms/cm$^3$.

A method of forming a mask for the charged particle beam exposure according to claim 5 of the present invention is a method employing an SOI substrate which is obtained by forming an oxidized film on a first silicon wafer, forming a separation layer by hydrogen ion implantation into the first silicon wafer via the oxidized film, bonding the ion implantation side oxidized film of said first silicon wafer onto a second silicon wafer, and cleaving said first silicon wafer from said second silicon wafer at said separation layer so that a silicon membrane layer is formed on said second silicon layer via the oxidized film, the method being characterized by comprising a step of causing epitaxial growth of silicon to form a silicon membrane layer on said silicon membrane layer.

In a method of forming a mask for the charged particle beam exposure, as a more preferable mode, according to claim 6 of the present invention, in the step of causing epitaxial growth of silicon, either or both of boron and phosphorus is doped.

In a method of forming a mask for the charged particle beam exposure according to claim 7 of the present invention is a method employing an SOI substrate which is obtained by forming a porous silicon on a first silicon wafer, causing epitaxial growth of silicon on said porous silicon, bonding an oxidized film formed on a second silicon wafer to the epitaxial grown silicon layer, and cleaving said first silicon wafer from said second silicon wafer at said porous silicon so that a silicon membrane layer is formed on said second silicon layer via the oxidized film, the method being characterized by doping either or both of boron and phosphorus during said epitaxial growth of silicon.

In a method of forming a mask for the charged particle beam exposure according to claim 8 of the present invention, said doping is conducted by using gas mainly containing either or both of boron and phosphorus and the doping amount is $1 \times 10^{18}$ atoms/cm$^3$ or more.

In a method of forming a mask for the charged particle beam exposure according to claim 9 of the present invention, said doping is conducted by using gas mainly containing boron and the average doping amount is in a range of from $6.7 \times 10^{18}$ to $1.3 \times 10^{20}$ atoms/cm$^3$.

In a method of forming a mask for the charged particle beam exposure according to claim 10 of the present invention, said doping is conducted by using gas mainly containing phosphorus and the average doping amount is in a range of from $2.0 \times 10^{19}$ to $4.3 \times 10^{20}$ atoms/cm$^3$.

According to the mask for the charged particle exposure of the present invention, since a high-quality SOI substrate without defects and having excellent uniformity in membrane thickness is employed and an epitaxial silicon layer doped with either or both of boron and phosphorus in high concentration is used as a mask pattern forming layer, the mask pattern forming layer is a low stress and zero defect layer of which thickness is optimum for forming a mask pattern for exposure and which has uniformed thickness and a high quality silicon oxidized film as the etching stop layer can be formed to have an enough thickness, thereby obtaining a mask for the charged particle beam exposure which is high quality and has high reliability.

According to the method of forming the mask for the charged particle beam exposure of the present invention, a membrane layer and an etching stop layer which are important for the characteristics of a mask can be formed to have desired thicknesses and low stress.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Hereinafter, embodiments of the present invention will be described, taking electron-beam exposure which is most likely expected to be in practical use among charged particle beam exposure technologies for example. Description will now be made as regard to a mask for use in the electron-beam exposure and its forming method with reference to the attached drawings.

(Mask for the Charged Particle Beam Exposure)

Figure 1:
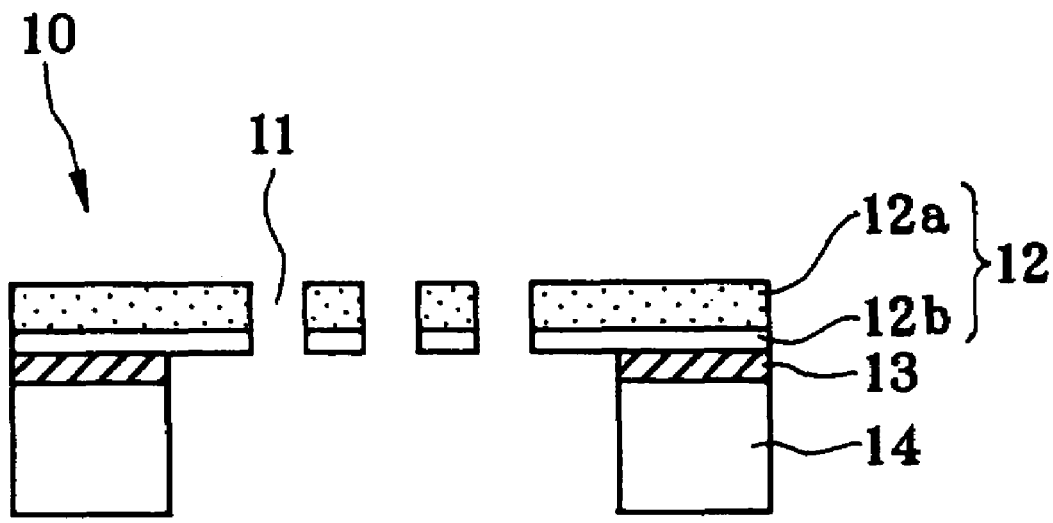
FIG. 1 is a partial sectional view showing an embodiment of a mask for the electron-beam exposure according to the present invention.
Figure 2:
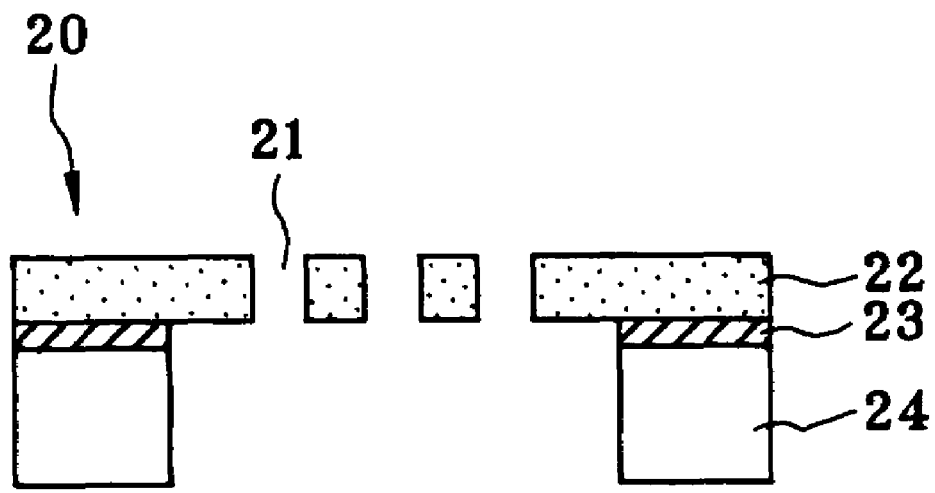
FIG. 2 is a partial sectional view showing another embodiment of a mask for the electron-beam exposure according to the present invention.

FIG. 1 and FIG. 2 are partial vertical sectional views schematically showing embodiments of a mask for the electron-beam exposure according to the present invention which is used for a stencil mask used for an electron-beam projection lithography.

In FIG. 1, a mask 10 for the electron-beam exposure has a structure comprising a membrane mask pattern 12 composed of silicon membrane layers 12a and 12b in which electron-beam through holes 11 are formed, a silicon oxidized film 13 used as an etching stop layer during the fabrication of mask, and struts 14 made of silicon. The silicon membrane layer 12a is an epitaxial grown layer, more preferably, containing either or both of boron and phosphorus in a doping amount of $1 \times 10^{18}$ atoms/cm$^3$ or more.

In FIG. 2, a mask 20 for the electron-beam exposure has a structure comprising a membrane mask pattern 22 composed of a silicon membrane in which electron-beam through holes 21 are formed, a silicon oxidized film 23 used as an etching stop layer during the fabrication of mask, and struts 24 made of silicon. The silicon membrane of the membrane mask pattern 22 is an epitaxial grown layer containing either or both of boron and phosphorus in a doping amount of $1 \times 10^{18}$ atoms/cm$^3$ or more.

The thicknesses of the membrane mask patterns 12, 22 of the masks 10, 20 for electron-beam exposure of the present invention are in a range of from 0.5 μm to several μm, more preferably, from 0.5 μm to 2 μm. The thicknesses of the silicon oxidized films 13, 23 of the masks 10, 20 for the electron-beam exposure are in a range of from 0.1 μm to 1 μm, more preferably, from 0.2 μm to 1 μm. The thicknesses of the struts (supporting silicon layers) 14, 24 on the backs depend on the exposure device and the form of the used mask and, for example, is in a range of from 500 μm to 725 μm in case of using a silicon wafer of 8 inches.

After studying the desired value of doping amount of either of boron or phosphorus into the silicon membrane of the membrane mask pattern 12, 22 in the mask 10, 20 for the electron-beam exposure shown in FIG. 1 and FIG. 2, the desired average doping amount to obtain high-performance mask for the electron-beam exposure are $6.7 \times 10^{18}$ to $1.3 \times 10^{20}$ atoms/cm$^3$ in case of doping boron or $2.0 \times 10^{19}$ to $4.3 \times 10^{20}$ atoms/cm$^3$ in case of doping phosphorus when the thickness of the silicon oxidized film 13, 23 is in a range of from 0.2 to 1 μm and the thickness of the silicon membrane of the membrane mask pattern 12, 22 is in a range of from 2 to 0.5 μm. If the doping amount of boron or phosphorus is lower than the lower limit of the aforementioned range, the silicon membrane 12, 22 is deformed due to the compressive stress (300 to 400 MPa) of the silicon oxidized film 13, 23. As a result of this, the configuration, dimensions, and the accuracy of position required for the mask pattern are not ensured. On the other hand, if the doping amount of boron or phosphorus is higher than the upper limit of the aforementioned range, the mask pattern is deformed due to the internal stress (tensile stress) of the silicon membrane 12, 22. As a result of this, the configuration, dimensions, and the accuracy of position are not ensured (reference: the image placement error of an EPL mask with 65 nm node is 10 nm or less).

(Method of Forming a Mask for the Charged Particle Beam Exposure)

(First Embodiment)

Figure 3A:
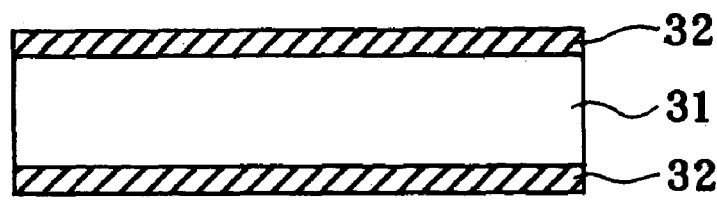
FIGS. 3(a)–3(e) are process charts showing a method of forming a mask for the electron-beam exposure according to the embodiment of the present invention shown in FIG. 1.
Figure 3B:
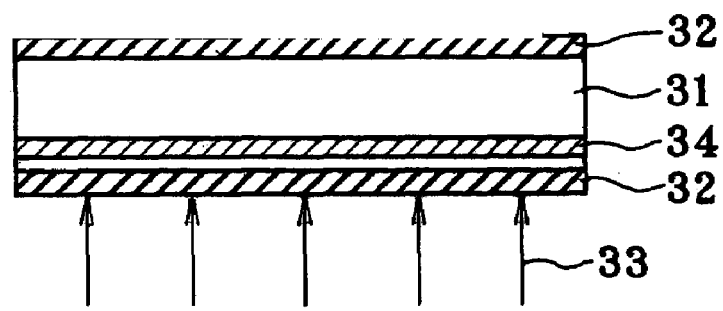
Figure 3C:
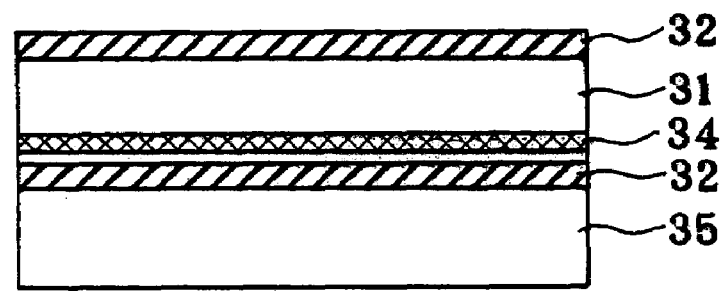
Figure 3D:
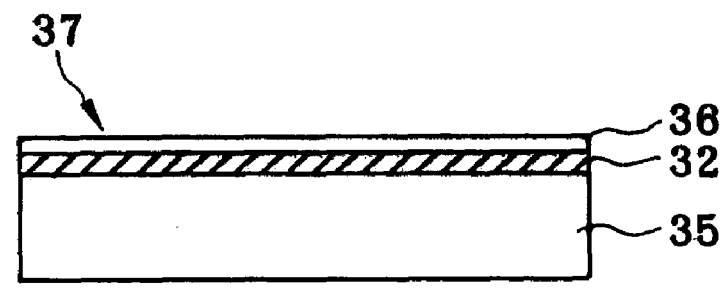
Figure 3E:
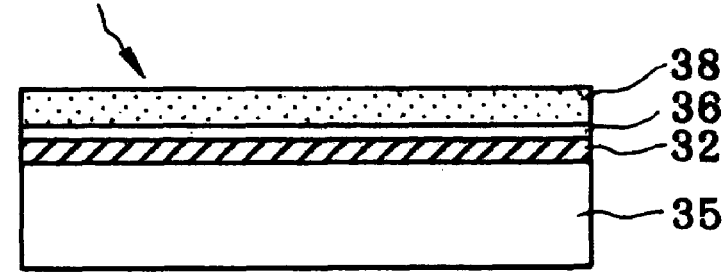

FIGS. 3(a)–3(e) and FIGS. 4(f)–4(i) following the process of FIG. 3(e) are process charts showing a method of forming a mask for the electron-beam exposure according to the first embodiment of the present invention shown in FIG. 1.

As shown in FIG. 3(a), a silicon oxidized film 32 which is subjected to thermal oxidation is formed on a first silicon wafer (bond wafer) 31. Though the size of the wafer depends on the exposure device in which the wafer is applied, a silicon wafer of 8 inches and 500–725 μm in thickness may be suitably employed. The thickness of the silicon oxidized film 32 subjected to thermal oxidation is preferably in a range of from 0.1 μm to 1 μm, more preferably from 0.2 μm to 1 μm for the purpose of functioning as the etching stop layer during the fabrication of the mask. If the thickness of the silicon oxidized film 32 is less than 0.2 μm, the silicon oxidized film 32 can not stably function as the etching stop layer because the obtained etching selectivity is insufficient. If the thickness exceeds 1 μm, pattern distortion may be caused due to too large internal stress.

Then, as shown in FIG. 3(b), hydrogen ion implantation 33 is conducted via the silicon oxidized film 32 so as to form a separation layer 34 as a defective layer by the hydrogen ion implantation 33 at a constant distance about a distance of 0.1–0.4 μm from the silicon oxide layer 32. Normally, the implanting amount is in a range from $3\times10^{16}$ to $10^{17}$ ions/cm$^2$.

After that, as shown in FIG. 3(c), the first silicon wafer (bond wafer) 31 which was subjected to ion implantation and the mirror-polished second silicon wafer (base wafer) 35 are bonded to each other at the implantation-side silicon oxidized film 32 side. Then, the first silicon wafer (bond wafer) 31 is cleaved at the separation layer 34 by heat treatment at 400–600° C. The second silicon wafer (base wafer) 35 is annealed at high temperature of 1000° C. or more in order to improve the bonding strength of the bonded portion and is subjected to touch polish. As shown in FIG. 3(d), a silicon membrane layer 36 is formed on the second silicon wafer (base wafer) 35 via the silicon oxidized film 32 so as to obtain an SOI substrate 37. The thickness of the silicon membrane layer 36 corresponds to the depth of the hydrogen ion implantation and is about 0.1–0.4 μm.

Then, as shown in FIG. 3(e), another silicon membrane layer 38 which is an epitaxial grown layer is formed on the silicon membrane layer 36 of the aforementioned SOI substrate 37 so as to obtain a mask substrate 39 having the silicon membrane with predetermined thickness. The total thickness of the silicon membrane layers 36 and 38 is preferably in a range of from 0.5 to 2 μm.

The epitaxial growth of the silicon membrane layer 38 can be caused by using a commercial epitaxial reactor and using either one of $SiH_4$, $SiHCl_3$, $SiH_2Cl_2$ with hydrogen gas as carrier gas, at a predetermined temperature, a predetermined pressure, for example, at a temperature in a range of from 850 to 1,050° C. and at a pressure in a range of from $1\times10^{-2}$ to 760 Torr.

According to the present invention, to avoid the deformation during fabrication of a membrane mask pattern, $B_2H_6$ gas or $PH_3$ gas is added and either one or both of boron and phosphorus is doped simultaneously with causing the epitaxial growth of the silicon membrane layer 38. The doping of boron and/or phosphorus provides tensile stress, thereby forming a mask with high accuracy of position during formation of the mask pattern. The doping amount of either one or both of boron and phosphorus is $1\times10^{18}$ atoms/cm$^3$ or more.

Figure 4F:
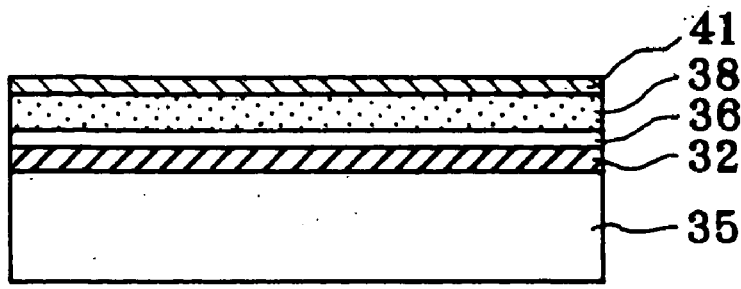
FIGS. 4(f)–4(i) are process charts following the process of FIG. 3(e) showing the method of forming the mask for the electron-beam exposure.
Figure 4G:
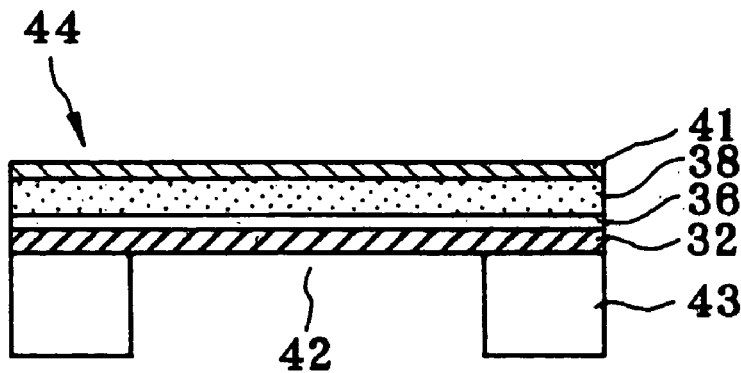
Figure 4H:
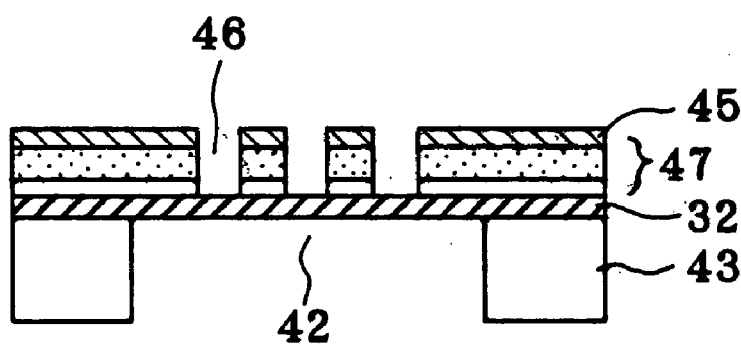

Then, a hard mask layer 41 as a masking member during silicon etching is formed on the silicon membrane layer 38 of the mask substrate 39 (FIG. 4(f)). As the material of the hard mask layer 41, one selected from a group consisting of Cr, Ti, Ta, Mo, W, and Zr and oxides, nitrides, and oxynitrides of these metals is used. The hard mask layer is formed to have a thickness of several hundreds nm by vacuum film deposition method such as sputtering.

A protective film for etching process of forming an opening corresponding to an exposure region by photoresist or the like is provided on the silicon wafer 35 which will be supporting grillage. Then, the silicon wafer 35 is removed by dry-etching from the back of the substrate in such a manner as to reach the silicon oxidized film 32 which functions as the etching stop layer, thereby forming the opening 42 and strut 43. After that, the photoresist is removed so as to obtain a mask blank 44 (FIG. 4(g)).

The deep dry-etching of silicon wafer 35 can be carried out by an ICP-RIE (inductive coupled plasma-reactive ion etching) device which is commercially available. As process gas, fluoro gases such as $SF_6$, $CF_4$, $C_2F_6$, and $C_4F_8$ may be used. For example, Bosch process may be employed in which dry etching is carried out with high density plasma with alternately supplying an $SF_6$ gas and a $C_4F_8$ gas. In order to speed up the etching, oxygen and/or nitrogen may be mixed in a minute amount within such a range that has no influence on the mask material.

Then, an electron beam resist is coated on the hard mask layer 41 of the mask blank 44 and a predetermined pattern is drawn by an electron beam mask writer and developed, thus forming a resist pattern. After that, the hard mask pattern 45 is formed by etching the hard mask layer 41. The etching condition depends on the material of the hard mask member. After removing the resist pattern, the silicon membrane is removed partially at exposed portions by dry-etching so as to form a membrane mask pattern 47 provided with electron beam through-holes 46 (FIG. 4(h)). Employed as the dry etching carried out on the silicon membrane for forming the membrane mask pattern 47 must be high-precision trench etching. For example, a dry-etching using HBr gas may be employed.

Figure 4I:
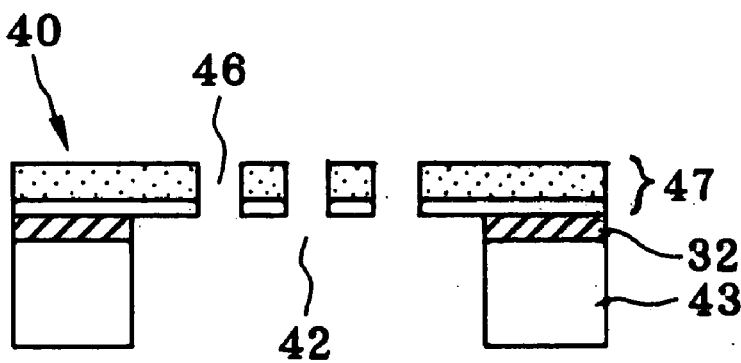

After that, the hard mask pattern 45 is removed by etching and the silicon oxidized film 32 as the etching stop layer in the opening 42 is removed by etching using buffer hydrofluoric acid, thereby forming a stencil mask 40 having the membrane mask pattern 47 provided with the electron beam through-holes 46 (FIG. 4(i)).

Description will now be made as regard to concrete example as an especially suitable example of an EPL mask by taking the mask 10 for the electron-beam exposure having the structure as shown in FIG. 1 in which the thickness of the silicon membrane 12a is 1.65 μm, the thickness of the silicon membrane layer 12b is 0.35 μm, the thickness of the silicon oxidized film 13 is 1.00 μm, and the thickness of the strut (supporting silicon) 14 is 725 μm.

Figure 5A:
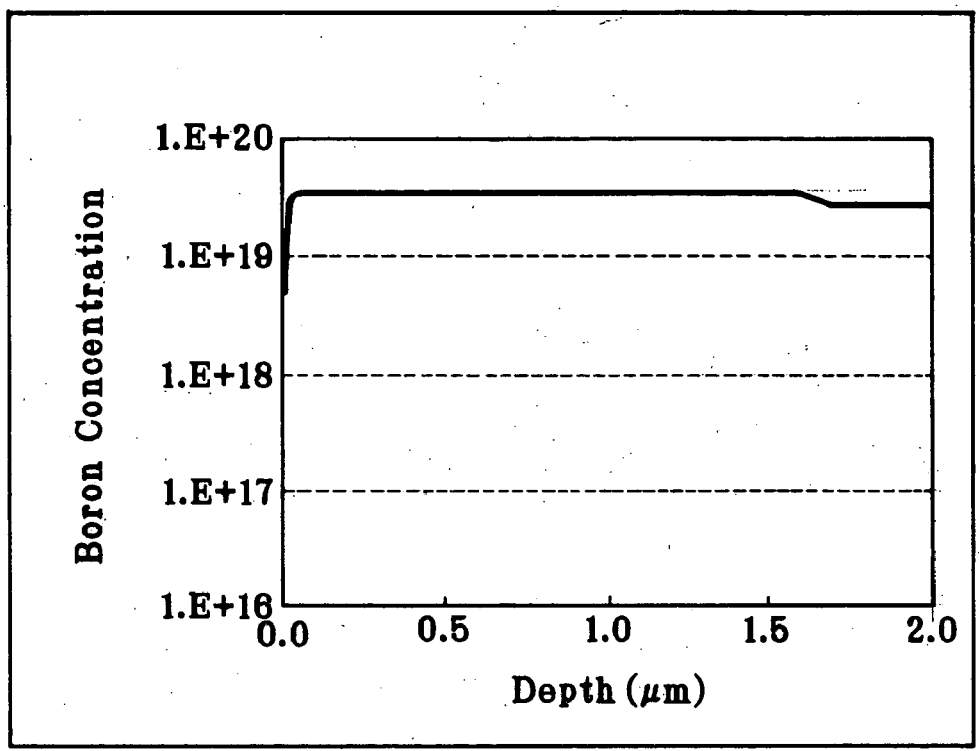
FIG. 5(a) is a graph showing a relation between the depth and boron concentration of a silicon membrane in the suitable example of a mask for the electron-beam exposure shown in FIG. 1 of the present invention and FIG. 5(b) is a graph showing the relation between the depth and boron concentration of a silicon membrane in a mask formed by way of a conventional ion implantation.
Figure 5B:
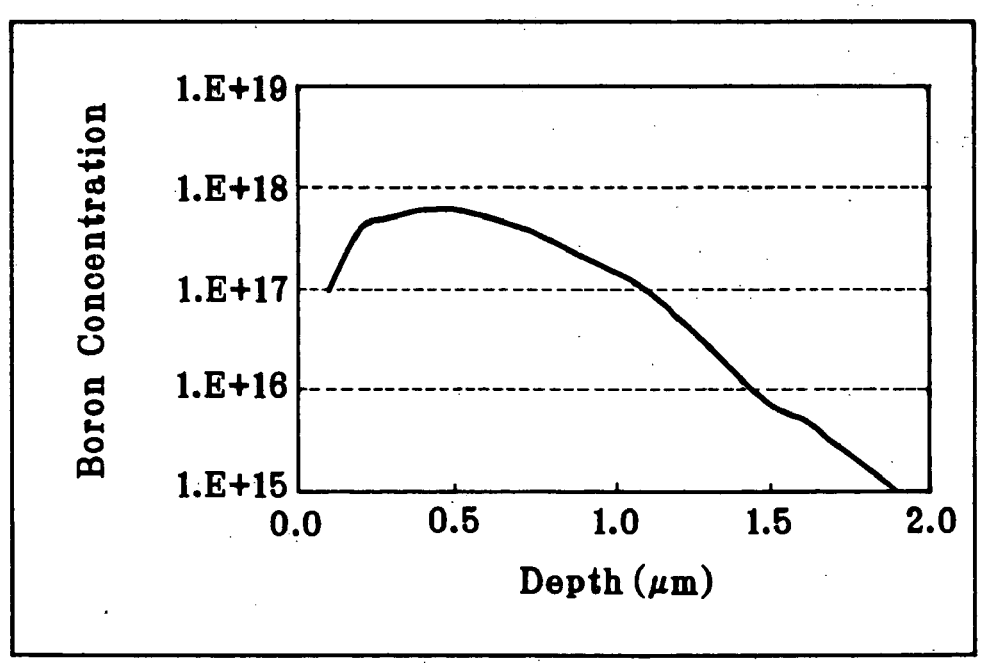

The relation between the depth and the boron concentration of the silicon membrane 12 of the obtained mask 10 is shown in FIG. 5(a). The boron concentration in the silicon membrane layer 12a of the silicon membrane 12 is $3.5 \times 10^{19}$ atoms/cm$^3$ and the boron concentration in the silicon membrane layer 12b is the boron concentration in the first silicon wafer (bond wafer) 31 (FIGS. 3(a)–3(c)) and is $2.7 \times 10^{19}$ atoms/cm$^3$. As compared to FIG. 5(b) showing an example between the depth and the boron concentration of a silicon membrane which is formed by first preparing a silicon membrane of 2 μm in thickness and then doping boron into the silicon membrane by ion implantation according to a conventional method, it is found that the case of doping boron simultaneously with the forming process of epitaxial growth according to the present invention can provide uniform boron concentration in the depth direction of the silicon membrane.

If the doping amount of boron is small, the silicon membrane is distorted due to the compressive stress (300–400 MPa in case that the thickness of the silicon oxidized film is 1 μm) of the silicon oxidized film. In the aforementioned suitable example, the distortion of the silicon oxidized film can be avoided by setting the doping amount of boron in the silicon membrane layer 12a to be $3.5 \times 10^{19}$ atoms/cm$^3$ and setting the doping amount of boron in the silicon membrane 12 including the boron concentration of the silicon membrane layer 12b to be $3.4 \times 10^{19}$ atoms/cm$^3$ as its weighted average.

It is believed that, in EPL masks, the internal stress of the silicon membrane is tensile stress and is preferably 10 MPa or less. This is because the projection pattern by electron beam is through holes (stencil) and the projection pattern is thus distorted when the tensile stress is large. In this case, the configuration, dimensions, and the accuracy of position required for the mask pattern are not ensured. In the suitable example, the tensile stress is 10 MPa or less.

(Second Embodiment)

Figure 6A:
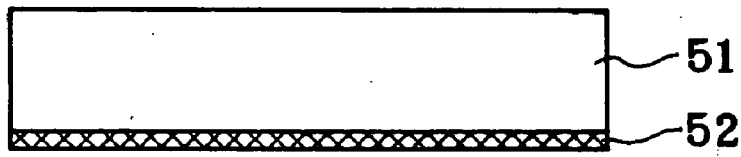
FIGS. 6(a)–6(d) are process charts showing a method of forming a mask for the electron-beam exposure according to the present invention shown in FIG. 2.
Figure 6B:
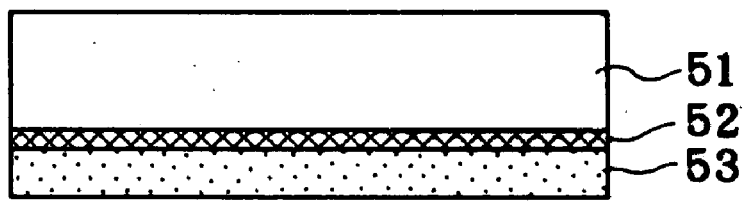
Figure 6C:
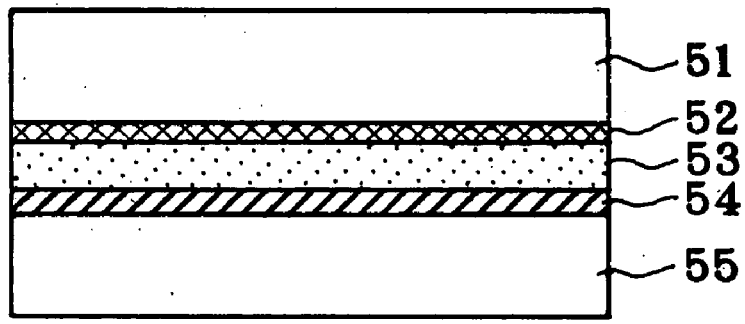
Figure 6D:
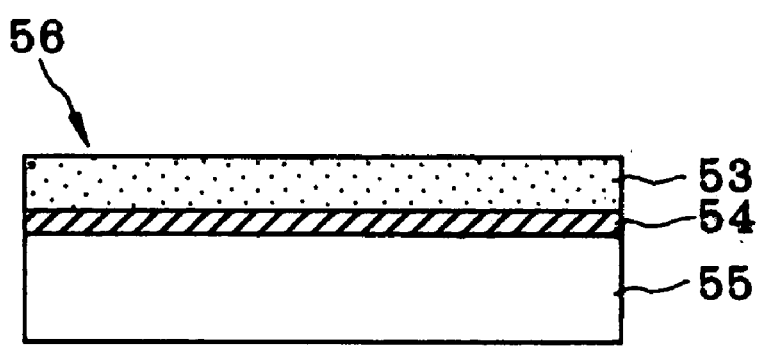

FIGS. 6(a)–6(d) and FIGS. 7(e)–7(h) following the process of FIG. 6(d) are process charts showing a method of forming a mask for the electron-beam exposure according to the embodiment of the present invention shown in FIG. 2.

A silicon wafer is first prepared. Though the size of the wafer depends on the exposure device in which the wafer is applied, a silicon wafer of 8 inches and 500–725 μm in thickness may be suitably employed.

As shown in FIG. 6(a), a porous silicon 52 is formed on one main surface of the first silicon wafer (bond wafer) 51. The porous silicon is formed by a method of conducting anodization in HF solution. Since the porous silicon is used as a separation layer, a thickness of from several μm to dozens μm is enough as the thickness of the porous silicon. After that, the silicon wafer with the porous silicon is baked at a temperature of from 1000° C. to 1100° C. in a hydrogen atmosphere in a CVD epitaxial reactor so as to seal pores in the surface of the porous silicon layer.

A silicon membrane layer 53 is formed by epitaxial growth on the porous silicon 52 having the sealed pores while either or both of boron and phosphorus is doped into the silicon membrane layer (FIG. 6(b)). The epitaxial growth of the silicon membrane layer 53 is caused by using either one of SiH$_4$, SiHCl$_3$, SiH$_2$Cl$_2$ with hydrogen gas as carrier gas, at a predetermined temperature, a predetermined pressure, for example, at a temperature in a range of from 850 to 1,050° C. and at a pressure in a range of from $1 \times 10^{-2}$ to 760 Torr with adding B$_2$H$_6$ gas or PH$_3$ gas. The concentration of boron or phosphorus is set to be $1 \times 10^{18}$ atoms/cm$^3$ or more.

As shown in FIG. 6(c), the first silicon wafer (bond wafer) 51 formed with the epitaxial silicon membrane layer 53 into which either or both of boron and phosphorus was doped is bonded onto a second silicon wafer (base wafer) 55 formed with a silicon oxidized film 54. Then, the first silicon wafer (bond wafer) 51 is cleaved at the porous layer 52 and the porous silicon still remaining on the surface is completely removed with a mixture of HF and hydrogen peroxide solution. In addition, the surface is planarized by hydrogen annealing, thereby obtaining an SOI substrate 56 in which the silicon membrane layer 53 doped with either or both of boron and phosphorus is formed on the second silicon wafer (base wafer) 55 via the silicon oxidized film 54.

Then, a hard mask layer 61 as a masking member during silicon etching is formed on the silicon membrane layer 53, in which a mask pattern will be formed, of the SOI substrate 56 (FIG. 7 (e)). As the material of the masking member, the same material as described in the first embodiment is used. The masking member is formed to have a thickness of several hundreds nm by vacuum film deposition method such as sputtering.

Then, an electron beam resist is coated on the hard mask layer 61, a predetermined pattern is drawn by an electron beam mask writer and developed, and the hard mask layer is etched at exposed portions so as to form a hard mask pattern 65. After removing the resist pattern, the silicon membrane layer is removed partially at exposed portions by dry-etching to form electron beam through-holes 66, thereby obtaining a membrane mask pattern 67 (FIG. 7 (f)). The dry etching for the membrane mask pattern 67 is the same as that of the first embodiment mentioned above.

A protective film for etching process of forming an opening corresponding to an exposure region by photoresist or the like is provided on the back of the substrate. Then, the silicon wafer 55 is removed by dry-etching from the back of the substrate in such a manner as to reach the silicon oxidized film 54 which functions as the etching stop layer, thereby forming the opening 62 and strut 63. After that, the resist is removed (FIG. 7(g)). The deep dry-etching of silicon can be carried out in the same manner as the first embodiment mentioned above.

Figure 7E:
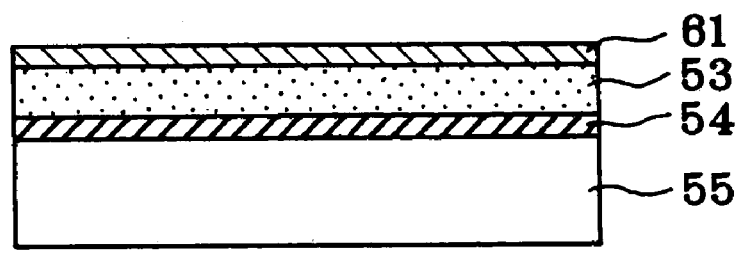
FIGS. 7(e)–7(h) are process charts following the process of FIG. 6(d) showing the method of forming the mask for the electron-beam exposure.
Figure 7F:
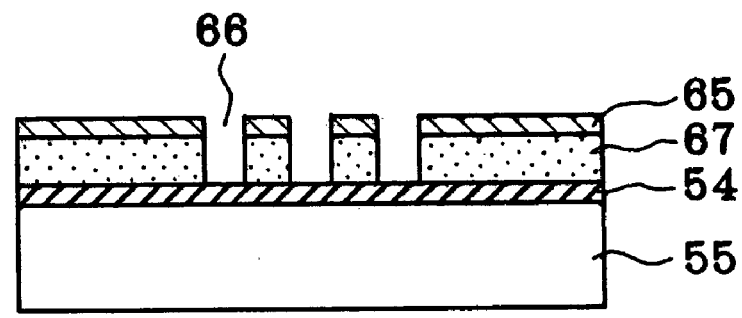
Figure 7G:
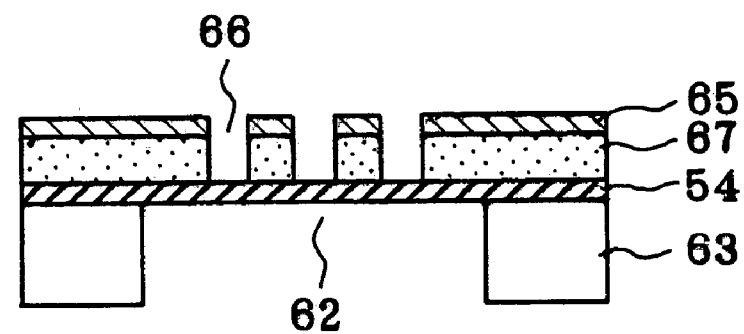
Figure 7H:
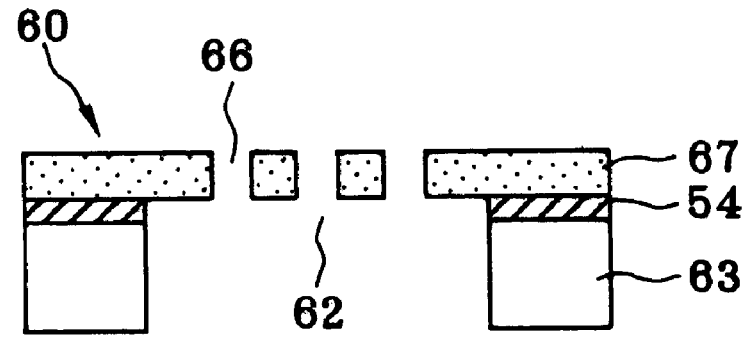
Figure 8A:
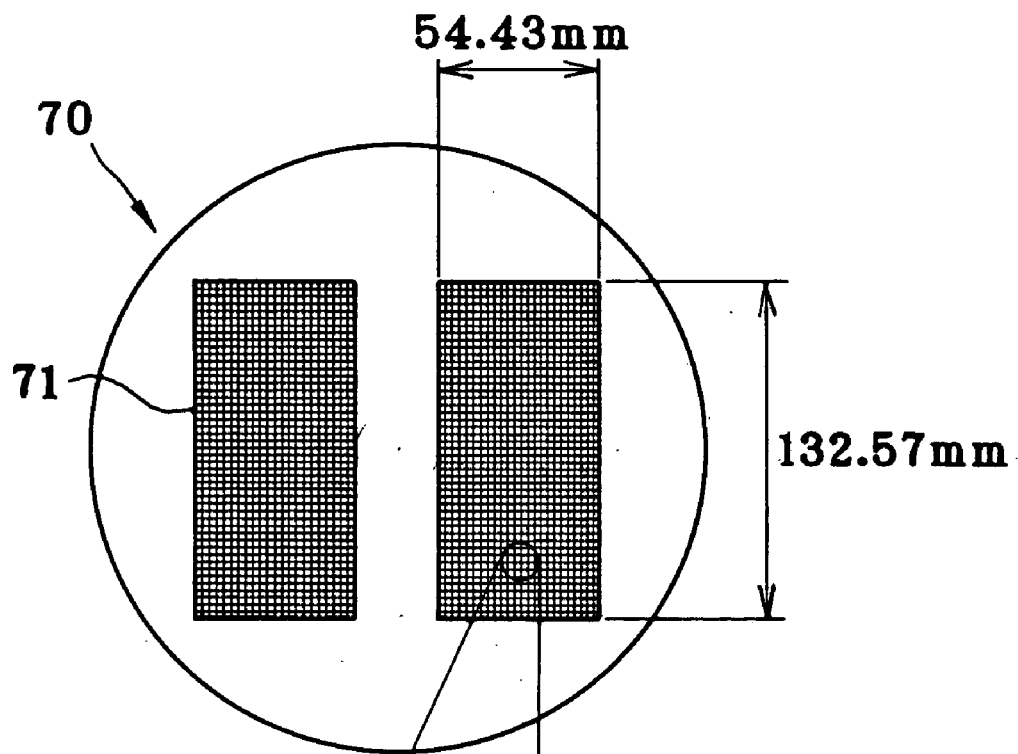
FIGS. 8(a), 8(b) are illustrations showing an example of a mask for the electron-beam exposure
Figure 8B:
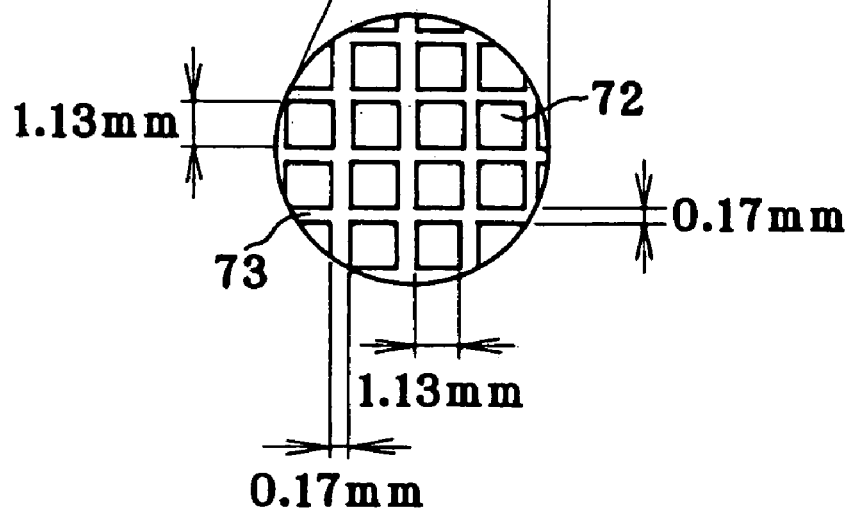

After that, the hard mask pattern 65 is removed by etching and the silicon oxidized film 54 as the etching stop layer in the opening 62 is removed by etching using buffer hydrofluoric acid, thereby forming a stencil mask 60 (FIG. 7(h)).

EXAMPLE 1

A first single crystal silicon wafer of 8 inches in diameter and 725 μm in thickness which was grown according to Czochralski method was subjected to thermal oxidation so as to form a silicon oxidized film of 1 μm in thickness on the surface thereof. Then, hydrogen ion was implanted into silicon to a depth of 0.4 μm with concentration of $1 \times 10^{17}$ ions/cm$^2$ via the silicon oxidized film by an ion implantation device so as to form a separation layer.

Then, the above first silicon wafer was bonded at the implantation-side to a mirror-polished second silicon wafer of 8 inches in diameter and 725 μm in thickness and was then subjected to heat treatment at a temperature of 500° C. After the heat treatment, the first silicon wafer was cleaved at the separation layer. The second silicon wafer was annealed at temperature of 1000° C. in order to improve the bonding strength of the bonded portion and was subjected to touch polish so as to obtain an SOI substrate having a silicon membrane of 0.35 µm in thickness on the second silicon wafer via the silicon oxidized film of 1 µm in thickness.

Then, the SOI substrate was placed in a commercial epitaxial reactor and was subjected to epitaxial growing process by flowing $SiH_2Cl_2$ (0.4 L/min) with hydrogen gas as carrier gas, at a temperature of 900° C. and at a pressure of 80 Torr and adding $B_2H_6$ gas, thereby depositing an epitaxial silicon layer with boron concentration of $3.5 \times 10^{19}$ atoms/cm$^3$ to have 1.65 µm in thickness. As a result of this, a mask substrate having the silicon oxidized film and the silicon membrane layer of which total thickness is 2 µm was obtained.

After that, Cr as a masking material during the silicon etching was sputtered on the silicon membrane of the abovementioned mask substrate, thereby forming a hard mask layer of 0.2 µm in thickness.

A photoresist using novolak resin was coated on the back-side supporting silicon layer to have a thickness of 15 µm and was exposed using a photo mask having an opening pattern and developed so as to form a resist pattern. As for the opening pattern, a unit of openings was 1.13×1.13 mm, and the width between the openings corresponding to the supporting silicon layer (strut) was 170 µm. The opening pattern comprises a plurality of the openings.

According to the aforementioned resist pattern, the backside silicon was removed by dry-etching to have a depth of 725 µm to form openings, using a process in which dry etching is carried out with an ICP-RIE etching device with alternately supplying an $SF_6$ gas and a $C_4F_8$ gas. After forming the openings, the resist pattern was removed by ashing process with oxygen plasma.

An electron beam resist was coated on the mask blank and a predetermined pattern was drawn by an electron beam mask writer and developed, thus forming a resist pattern having lines and spaces of 260 nm. According to the resist pattern, the Cr of the hard mask was subjected to dry-etching to form a hard mask pattern. After that, the resist pattern was removed. According to the hard mask pattern of Cr, the silicon membrane layer was removed partially at the exposed portions by dry-etching using $CF_4$ gas so as to form a mask pattern with electron beam through-holes. The mask pattern had lines and spaces of 260 nm.

The Cr as the hard mask was removed by etching using etching liquid of cerium (IV) diammonium nitrate series and portions of the silicon oxidized film exposed to the openings were removed using buffer hydrofluoric acid (hydrofluoric acid:ammonium fluoride=1:10), thereby forming a stencil mask as the mask for the electron-beam exposure.

The stencil mask of this example had openings of 1.13 ×1.13 mm formed in the back of the mask, supporting silicon (strut) of 170 µm in width and 725 µmin height, a mask pattern of 2 µm in thickness made of a silicon membrane, and lines and spaces of 260 nm. Since the silicon membrane has the mask pattern doped with boron with high concentration and having low stress, the obtained mask was a high-precision mask without misalignment of pattern.

EXAMPLE 2

A first silicon wafer (bond wafer) of 8 inches in diameter and 725 µm in thickness was prepared and was subjected to anodization in 50% HF solution at a current density of 100 mA/cm$^2$ so as to form a porous silicon layer of 10 µm in thickness on the silicon wafer.

After that, the silicon wafer with the porous silicon was baked at a temperature of 1000° C. in a hydrogen atmosphere in a CVD epitaxial reactor so as to seal pores in the surface of the porous silicon layer and was then subjected to epitaxial growing process by flowing $SiH_2Cl_2$ (0.4 L/min) with hydrogen gas (230 L/min) as carrier gas, at a temperature of 900° C. and at a pressure of 80 Torr and adding $B_2H_6$ gas, thereby depositing an epitaxial silicon layer with boron concentration of $3.4 \times 10^{19}$ atoms/cm$^3$ to have 2 µm in thickness.

A second silicon wafer of 8 inches in diameter and 725 µm in thickness with a thermally-oxidized film of 1 µm in thickness formed thereon was bonded to the first silicon wafer with the epitaxial silicon layer mentioned above and was then subjected to heat treatment at a temperature of 500° C. After the heat treatment, the first silicon wafer was cleaved at the porous silicon layer. The second silicon wafer was annealed at temperature of 1000° C. in order to improve the bonding strength of the bonded portion and was subjected to touch polish so as to obtain an SOI substrate having a silicon membrane of 2 µm in thickness on the second silicon wafer via the silicon oxidized film of 1 µm in thickness.

After that, Cr as a masking material during the silicon etching was sputtered on the silicon membrane of the abovementioned mask substrate, thereby forming a hard mask layer of 0.2 µm in thickness.

An electron beam resist was coated on the hard mask layer and a predetermined pattern was drawn by an electron beam mask writer and developed, thus forming a resist pattern having lines and spaces of 260 nm. According to the resist pattern, the Cr of the hard mask layer was subjected to dry-etching to form a hard mask pattern. After that, the resist pattern was removed. According to the hard mask pattern of Cr, the silicon membrane layer was removed partially at the exposed portions by dry-etching using $CF_4$ gas so as to form a mask pattern with electron beam through-holes. The mask pattern had lines and spaces of 260 nm.

A photoresist using novolak resin was coated on the back-side supporting silicon layer to have a thickness of 15 µm and was exposed using a photo mask having an opening pattern and developed so as to form a resist pattern. As for the opening pattern, a unit of openings was 1.13×1.13 mm, and the width between the openings corresponding to the supporting silicon layer (strut) was 170 µm. The opening pattern comprises a plurality of the openings.

According to the aforementioned resist pattern, the backside silicon was removed by dry-etching to have a depth of 725 µm to form openings, using Bosch process in which dry etching is carried out with an ICP-RIE etching device with alternately supplying an $SF_6$ gas and a $C_4F_8$ gas. After forming the openings, the resist pattern was removed by ashing process with oxygen plasma.

Then, the Cr as the hard mask layer was removed by etching using etching liquid of cerium (IV) diammonium nitrate series and portions of the silicon oxidized film exposed to the openings were removed by etching using buffer hydrofluoric acid (hydrofluoric acid:ammonium fluoride=1:10), thereby forming a stencil mask as the mask for the electron-beam exposure.

The stencil mask of this example had openings of 1.13 ×1.13 mm formed in the back of the mask, supporting silicon (strut) of 170 µm in width and 725 µmin height, a mask pattern of 2 µm in thickness made of a silicon membrane, and lines and spaces of 260 nm. Since the silicon membrane has the mask pattern doped with boron with high concentration and having low stress, the obtained mask was a high-precision mask without misalignment of pattern.

We claim:

1. A mask for the charged particle beam exposure, which is made by employing an SOI substrate having a silicon layer on which a silicon oxidized film and a silicon membrane layer are formed, wherein said silicon membrane layer is significantly or entirely made of epitaxial grown silicon and said silicon membrane layer contains either or both of boron and phosphorus in a doping amount of $1 \times 10^{18}$ atoms/cm$^3$ or more.

2. A mask for the charged particle beam exposure, which is made by employing an SOI substrate having a silicon layer on which a silicon oxidized film and a silicon membrane layer are formed, wherein said silicon membrane layer is significantly or entirely made of epitaxial grown silicon and said silicon membrane layer contains either or both of boron and phosphorus in a doping amount of $1 \times 10^{18}$ atoms/cm$^3$ or more, wherein the thickness of said silicon oxidized film is in a range of from 0.2 μm to 1 μm and the thickness of said silicon membrane layer is in a range from 0.5 μm to 2 μm.

3. A mask for the charged particle beam exposure as claimed in claim 1 or 2, wherein boron is contained in said silicon membrane layer in an average doping amount of from $6.7 \times 10_{18}$ to $1.3 \times 10_{20}$ atoms/cm$_3$.

4. A mask for the charged particle beam exposure as claimed in claim 1 or 2, wherein phosphorus is contained in said silicon membrane layer in an average doping amount of from $2.0 \times 10^{19}$ to $4.3 \times 10^{20}$ atoms/cm$^3$.

5. A method of forming a mask for the charged particle beam exposure, employing an SOI substrate which is obtained by forming an oxidized film on a first silicon wafer, forming a separation layer by hydrogen ion implantation into the first silicon wafer via the oxidized film, bonding the ion implantation side oxidized film of said first silicon wafer onto a second silicon wafer, and cleaving said first silicon wafer from said second silicon wafer at said separation layer so that a silicon membrane layer is formed on said second silicon layer via the oxidized film, the method being characterized by comprising a step of causing epitaxial growth of silicon to form a silicon membrane layer on said silicon membrane layer.

6. A method of forming a mask for the charged particle beam exposure as claimed in claim 5, wherein in said step of causing epitaxial growth of silicon, either or both of boron and phosphorus is doped.

7. A method of forming a mask for the charged particle beam exposure, employing an SOI substrate which is obtained by forming a porous silicon on a first silicon wafer, causing epitaxial growth of silicon on said porous silicon, bonding an oxidized film formed on a second silicon wafer to the epitaxial grown silicon layer, and cleaving said first silicon wafer from said second silicon wafer at said porous silicon so that a silicon membrane layer is formed on said second silicon layer via the oxidized film, the method being characterized by doping either or both of boron and phosphorus during said epitaxial growth of silicon.

8. A method of forming a mask for the charged particle beam exposure as claimed in claim 6 or 7, wherein said doping is conducted by using gas mainly containing either or both of boron and phosphorus and the doping amount is $1 \times 10^{18}$ atoms/cm$^3$ or more.

9. A method of forming a mask for the charged particle beam exposure as claimed in claim 8, wherein said doping is conducted by using gas mainly containing boron and the average doping amount is in a range of from $6.7 \times 10^{18}$ to $1.3 \times 10^{20}$ atoms/cm$^3$.

10. A method of forming a mask for the charged particle beam exposure as claimed in claim 8, wherein said doping is conducted by using gas mainly containing phosphorus and the average doping amount is in a range of from $2.0 \times 10^{19}$ to $4.3 \times 10^{20}$ atoms/cm$^3$.

* * * * *